United States Patent
Cho et al.

(10) Patent No.: US 8,749,414 B2
(45) Date of Patent: Jun. 10, 2014

(54) APPARATUS AND METHOD FOR CALIBRATING TIME CONSTANT, AND LOW PASS DELTA SIGMA MODULATION APPARATUS INCLUDING THE SAME

(71) Applicant: Electronics and Telecommunications Research Institute, Daejeon (KR)

(72) Inventors: Young Kyun Cho, Daejeon (KR); Bong Hyuk Park, Daejeon (KR); Jae Ho Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/715,056

(22) Filed: Dec. 14, 2012

(65) Prior Publication Data

US 2014/0002285 A1    Jan. 2, 2014

(30) Foreign Application Priority Data

Jun. 27, 2012   (KR) .......................... 10-2012-0069446

(51) Int. Cl.
*H03M 1/10*    (2006.01)
*H03M 3/00*    (2006.01)

(52) U.S. Cl.
CPC ............ *H03M 1/1009* (2013.01); *H03M 3/458* (2013.01)
USPC .......................................... 341/120; 341/143

(58) Field of Classification Search
CPC ............................ H03M 1/1009; H03M 3/458
USPC ................... 341/155, 120, 143; 327/551–553
See application file for complete search history.

(56) References Cited

U.S. PATENT DOCUMENTS

| | | | |
|---|---|---|---|
| 5,594,440 A * | 1/1997 | Onaya ........................... | 341/131 |
| 6,682,216 B1 | 1/2004 | Small, IV et al. | |
| 7,193,546 B1 * | 3/2007 | Melanson ..................... | 341/143 |
| 7,324,028 B2 | 1/2008 | Hsieh et al. | |
| 7,821,341 B2 | 10/2010 | Kim et al. | |
| 7,944,378 B1 * | 5/2011 | Pesenti .......................... | 341/118 |
| 7,944,385 B2 | 5/2011 | Guillou | |
| 8,199,038 B2 | 6/2012 | Kim et al. | |
| 8,416,105 B2 * | 4/2013 | Lai et al. ....................... | 341/120 |
| 8,552,797 B2 * | 10/2013 | Lin ................................ | 327/553 |
| 2009/0153382 A1 | 6/2009 | Philips | |
| 2012/0200440 A1 * | 8/2012 | Okada et al. .................. | 341/143 |

FOREIGN PATENT DOCUMENTS

KR   10-2010-0072976 A   7/2010
KR   10-2011-0011532 A   2/2011

OTHER PUBLICATIONS

Shouli Yan et al., "A Continuous-Time ΣΔ Modulator With 88-dB Dynamic Range and 1.1-MHz Signal Bandwith", IEEE Journal of Solid-State Circuits, Jan. 1, 2004, pp. 75-86, vol. 39, No. 1.

* cited by examiner

*Primary Examiner* — Brian Young
(74) *Attorney, Agent, or Firm* — Rabin & Berdo, P.C.

(57) ABSTRACT

A time constant calibration apparatus of a low pass delta sigma modulation apparatus calibrates a time constant of an integrator using a resistor and a capacitor, and the time constant calibration apparatus generates a reference voltage by flowing a reference current to a reference resistor, converts the reference voltage to a digital signal, and varies a value of a resistor of an integrator and a value of a capacitor from the digital signal.

12 Claims, 9 Drawing Sheets

APPARATUS AND METHOD FOR CALIBRATING TIME CONSTANT, AND LOW PASS DELTA SIGMA MODULATION APPARATUS INCLUDING THE SAME

CROSS-REFERENCE TO RELATED APPLICATION

This application claims priority to and the benefit of Korean Patent Application No. 10-2012-0069446 filed in the Korean Intellectual Property Office on Jun. 27, 2012, the entire contents of which are incorporated herein by reference.

BACKGROUND OF THE INVENTION (a) Field of the Invention

The present invention relates to a method and apparatus for calibrating a time constant, and a low pass delta sigma modulation apparatus including the same. More particularly, the present invention relates to a method of calibrating values of a resistor and a capacitor having changing characteristics by a process-voltage-temperature (PVT) variation in a low pass delta sigma modulation apparatus.

(b) Description of the Related Art

For high spectral efficiency, a next generation wireless communication system such as 3rd generation partnership project (3GPP) long term evolution (LTE) and worldwide interoperability for microwave access (WiMAX) uses a modulated wideband signal through orthogonal frequency division multiplexing (OFDM). Therefore, development of a high efficiency transmitter for reducing DC power consumption is necessary. Accordingly, an effort for maximizing efficiency has been executed through various structures of power amplifiers such as a Doherty power amplifier and an envelope tracking amplifier. Such a power amplifier is characterized in that a non-constant envelope signal is applied to an input of the power amplifier, and when a signal having a large peak to average power ratio (PAPR) is applied to an input of the amplifier, non-linearity of the amplifier increases and thus there is a limitation in improving efficiency of the power amplifier.

In order to overcome a drawback of such a power amplifier, a structure that can embody a transmitter using a switch mode power amplifier (SMPA) instead of a general power amplifier was suggested.

An input to the SMPA is limited to a signal having a constant envelope, and in order to generate such an input signal, a method such as an envelope delta-sigma modulator (EDSM) and envelop pulse width modulation (EPWM) was suggested. Because the SMPA always operates in a saturation region through such a modulation apparatus, linearity of a non-constant envelope signal is guaranteed and high switching efficiency is obtained. A structure including both an SMPA and a modulation apparatus for converting a non-constant envelope signal to a constant envelope signal is referred to as a class-S power amplifier.

A modulation apparatus using an EDSM method is formed based on a polar modulation method, and the modulation apparatus uses a low pass delta-sigma modulator (LPDSM).

A transmitter in a wireless communication system should satisfy an out-of-band emission specification such as a spectrum mask or an adjacent channel leakage power ratio (ACLR). Quantization noise that is generated in the LPDSM of a modulation apparatus using an EDSM method attenuates such output spectrum characteristics, and thus a design of the LPDSM has an important influence on performance of an entire transmitter. When an LTE input signal having a bandwidth of 20 MHz is applied, in order to obtain error vector magnitude (EVM) characteristics of less than 4%, the LPDSM should have SNR characteristics of about 30 dB or more, and an SNR performance of 40 dB or more is requested in consideration of peak to average power ratio (PAPR) characteristics of 10 dB or more and a design margin.

When designing the LPDSM, one of items to importantly consider is a PVT change amount. Actually, in order to insensitively respond to such a PVT change amount, active elements such as an amplifier or a quantizer and a digital-to-analog converter (DAC) are designed to have a sufficient margin. Therefore, performance of a circuit may not be degraded by some change amount.

However, when passive elements such as a resistor and a capacitor are designed to have a margin like active elements, an RC time constant that is designed to operate in a specific frequency changes. When the RC time constant changes in the LPDSM, quantization noise of the LPDSM is shifted within a bandwidth, and a loop filter becomes unstable and thus the SNR is entirely attenuated. Because of this, a method of designing passive elements to have a margin cannot be used. Therefore, in order to constantly maintain operation of a circuit according to a change amount of the PVT, a method of adding specific calibration is used.

In order to avoid degradation of performance of the LPDSM by maintaining an RC time constant, a resistance that is changed according to a change amount of the PVT should be compensated.

A method of compensating a resistance that is changed according to a change amount of the PVT includes a method of compensating a capacitor value and a feedback current value of a DAC without changing a changed resistance. This method should adjust a current amount of the DAC. It is very high difficult to design a circuit to adjust a current of the DAC, which is one of portions that have a direct influence on noise characteristics and that should be minutely designed in the LPDSM.

Further, a method of compensating a resistance that is changed according to a change amount of the PVT includes a self-calibrating method. The self-calibrating method has a structure that analyzes a noise-transfer function (NTF) of most LPDSMs or in-band noise characteristics, and that feeds back a result thereof and that compensates values of a resistor and a capacitor. This method should use a separate block that analyzes the NTF and use a very complicated algorithm and thus there is much difficulty in embodying an actual analog circuit.

SUMMARY OF THE INVENTION

The present invention has been made in an effort to provide a method and apparatus for calibrating a time constant and a low pass delta sigma modulation apparatus including the same having advantages of calibrating a value of a passive element such as a resistor and a capacitor with a more simple and reliable method in order to prevent performance degradation of an LPDSM according to a change amount of a PVT.

An exemplary embodiment of the present invention provides an apparatus that calibrates a time constant of an integrator using a resistor and a capacitor in a low pass delta sigma modulation apparatus. The time constant calibration apparatus includes a reference current generator, a reference resistor, a comparison circuit, and a digital processor. The reference current generator generates a reference current. The reference resistor is connected between the reference current generator and a ground terminal. The comparison circuit compares a first reference voltage that is generated by the reference resistor and the reference current and a plurality of second reference voltages, and converts the first reference voltage to a digital signal. The digital processor generates a digital control signal that varies a value of at least one of the resistor and the capacitor from the digital signal and outputs the digital control signal to the integrator.

The resistor may include a plurality of unit resistors that are coupled in series between an input terminal of the low pass delta sigma modulation apparatus and an operational transconductance amplifier of the integrator, and a plurality of first switches that are each connected to both ends of some unit resistors of the plurality of unit resistors. On/off of the plurality of first switches may be determined according to the digital control signal.

The capacitor may include a plurality of unit capacitors that are each coupled in parallel between an input terminal and an output terminal of the operational transconductance amplifier, and a plurality of second switches that are connected between each unit capacitor and the input terminal of the operational transconductance amplifier or that are connected between each unit capacitor and the output terminal of the operational transconductance amplifier. On/off of the plurality of second switches may be determined according to the digital control signal.

A variable range of the capacitor according to the digital control signal may be set to half of a variable range of the resistor according to the digital control signal.

The digital processor may vary only a value of the resistor or both values of the resistor and the capacitor according to an SNR, which is a design specification of the low pass delta sigma modulation apparatus.

Another embodiment of the present invention provides a method of calibrating a time constant of an integrator using a resistor and a capacitor in a time constant calibration apparatus of a low pass delta sigma modulation apparatus. The method includes: generating a reference current; detecting a change amount of a reference resistor by flowing the reference current to the reference resistor; generating a digital control signal to correspond to the change amount of the reference resistor; and varying a value of at least one of the resistor and the capacitor according to the digital control signal.

The resistor may include a plurality of unit resistors that are coupled in series between an input terminal of the low pass delta sigma modulation apparatus and an operational transconductance amplifier of the integrator, and a plurality of first switches that are each connected to both ends of some unit resistors of the plurality of unit resistors. The varying of a value may include turning-on at least one of the plurality of first switches according to the digital control signal.

The capacitor may include a plurality of unit capacitors that are each coupled in parallel between an input terminal and an output terminal of the operational transconductance amplifier, and a plurality of second switches that are connected between each unit capacitor and the input terminal of the operational transconductance amplifier or that are connected between each unit capacitor and the output terminal of the operational transconductance amplifier. The varying of a value may include turning on at least one of the plurality of second switches according to the digital control signal.

The detecting of a change amount may include generating a first reference voltage by flowing the reference current to the reference resistor, and converting the first reference voltage to a digital signal.

Yet another embodiment of the present invention provides a low pass delta sigma modulation apparatus. The low pass delta sigma modulation apparatus includes an integrator, a quantizer, and a time constant calibration apparatus. The integrator integrates an input signal using a resistor and a capacitor. The quantizer quantizes an output signal of the integrator in a quantization level. The time constant calibration apparatus generates a reference voltage by flowing a reference current to a reference resistor, converts the reference voltage to a digital signal, and varies a value of at least one of a resistor and a capacitor of the integrator from the digital signal.

The time constant calibration apparatus may include: a reference current generator that generates a reference current; a reference resistor that is connected between the reference current generator and a ground terminal; a comparison circuit that compares a first reference voltage that is generated by the reference resistor and the reference current and a plurality of second reference voltages, and that converts the first reference voltage to a digital signal; and a digital processor that generates a digital control signal that varies a value of at least one of the resistor and the capacitor from the digital signal, and that outputs the digital control signal to the integrator.

The digital processor may output the digital control signal to only the resistor or to the resistor and the capacitor according to a design specification of the low pass delta sigma modulation apparatus.

DETAILED DESCRIPTION OF THE EMBODIMENTS

Figure 1:
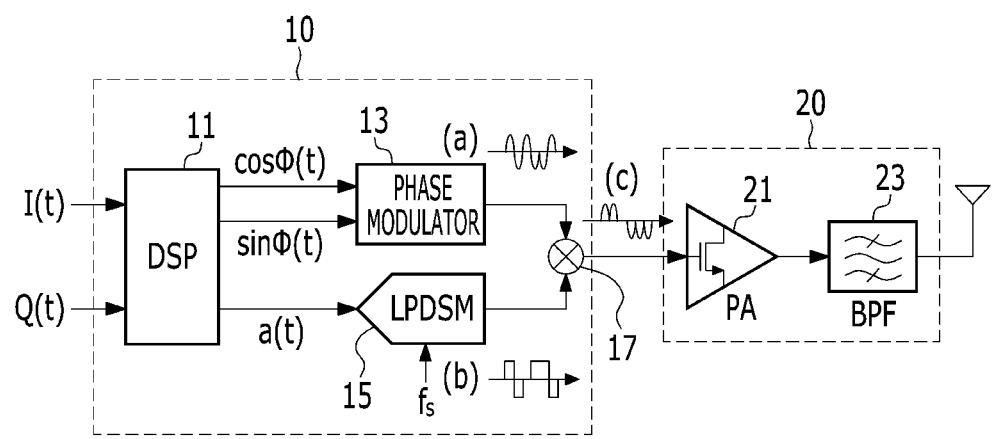
FIG. 1 is a diagram illustrating a structure and concept of a Class-S power amplifier.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, in the entire specification and claims, unless explicitly described to the contrary, the word "comprise" and variations such as "comprises" or "comprising" will be understood to imply the inclusion of stated elements but not the exclusion of any other elements.

Hereinafter, a method and apparatus for calibrating a time constant and a low pass delta sigma modulation apparatus including the same according to an exemplary embodiment of the present invention will be described in detail with reference to the drawings.

FIG. 1 is a diagram illustrating a structure and concept of a class-S power amplifier.

As shown in FIG. 1, the class-S power amplifier includes a switch mode power amplifier (SMPA) 20 and a modulation apparatus 10 that converts a non-constant envelope signal to a constant envelope signal.

The SMPA 20 includes a power amplifier (PA) 21 and a band-pass filter (BPF) 23, and an input signal is amplified in the PA 21, while the amplified signal is band-pass filtered and output in the BPF 23.

In this case, in order to generate a signal having a constant envelope with the input signal of the PA 21, the modulation apparatus 10 uses a method such as an envelope delta-sigma modulator (EDSM) or envelop pulse width modulation (EPWM) method. FIG. 1 illustrates a modulation apparatus using an EDSM method.

The modulation apparatus 10 using an EDSM method mainly uses a polar modulation method of separating and transmitting a phase signal and an envelope signal from baseband I and Q signals [I(t), Q(t)].

The modulation apparatus 10 includes a digital signal processing (DSP) 11, a phase modulator 13, a low pass delta-sigma modulator (LPDSM) 15, and a mixer 17.

The DSP 11 calculates a magnitude [a(t)] and a phase [φ(t)] of a baseband signal from baseband I and Q signals [I(t), Q(t)] using a coordinate rotation digital computer (CORDIC) algorithm, outputs a phase signal [cos φ(t), sin φ(t)] to the phase modulator 13, and outputs the calculated magnitude signal [a(t)] to the LPDSM 15.

The phase signal [cos φ(t), sin φ(t)] that is input to the phase modulator 13 is phase-modulated by the phase modulator 13, as shown in (a) of FIG. 1, and the magnitude signal [a(t)] that is input to the LPDSM 15 is delta-sigma modulated by the LPDSM 15, as shown in (b) of FIG. 1. The phase-modulated signal and the delta-sigma modulated signal are combined by the mixer 17. Thereby, an output of the mixer 17 becomes a constant envelope signal of a sine wave shape having 0 or a constant magnitude, as shown in (c) of FIG. 1, and such a constant envelope signal is input to the SMPA 20 and drives the SMPA 20.

An output signal of the mixer 17 is input and amplified to the PA 21 of the SMPA 20, and out-of-band quantization noise of the amplified signal is removed by passing through the BPF 23. The signal in which quantization noise is removed is transmitted through a transmitting antenna. Thereby, characteristics of a linear amplifier having high power-efficiency can be obtained.

Figure 2:
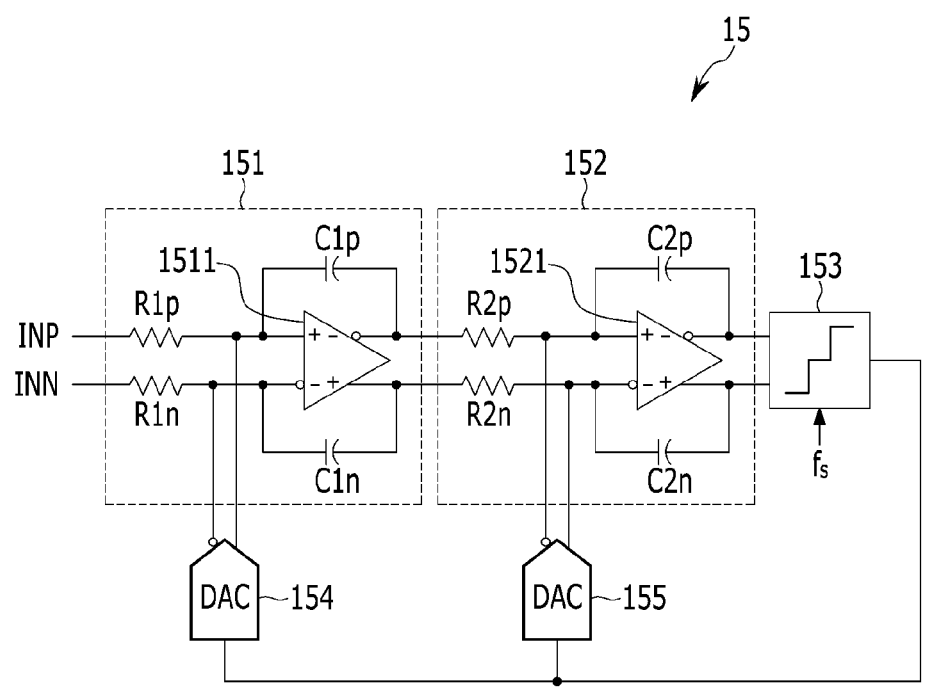
FIG. 2 is a diagram illustrating an example of an LPDSM structure that is shown in FIG. 1.

FIG. 2 is a diagram illustrating an example of an LPDSM structure that is shown in FIG. 1.

The LPDSM 15 that is shown in FIG. 2 is a secondary LPDSM of a differential input and differential output structure, and the LPDSM 15 of such a structure includes a primary integrator 151 that integrates differential phase input signals INP and INN, a secondary integrator 152 that integrates an output signal of the primary integrator 151, a quantizer 153 that determines an output voltage from a differential phase output signal of the secondary integrator 152, and digital-to-analog converters (DAC) 154 and 155 that feed back an output voltage of the quantizer 153 to the primary integrator 151 and the secondary integrator 152, respectively.

FIG. 2 illustrates an active RC structure using a resistor and a capacitor as the primary and secondary integrators 151 and 152, but a transconductance (gm)-C structure using gm and a capacitor as the primary and secondary integrators 151 and 152 may be used.

The primary integrator 151 includes resistors R1p and R1n, integral capacitors C1p and C1n, and an operational transconductance amplifier (OTA) 1511.

The resistor R1p is connected between an input terminal of the LPDSM 15 to which a positive input signal INP is input and a positive input terminal of differential phase input terminals of the OTA 1511. Further, a negative output terminal of differential phase output terminals of the DAC 154 is connected to a negative input terminal of the OTA 1511, and the integral capacitor C1p is connected between the positive input terminal of the OTA 1511 and a negative output terminal of the OTA 1511.

The resistor R1n is connected between an input terminal of the LPDSM 15 to which the positive input signal INN is input and a negative input terminal of differential phase input terminals of the OTA 1511. Further, a positive output terminal of differential phase output terminals of the DAC 154 is connected to a positive input terminal of the OTA 1511. The integral capacitor C1n is connected between the negative input terminal and the positive output terminal of the OTA 1511.

The primary integrator 151 inversely integrates and outputs the positive input signal INP, and inversely integrates and outputs the negative input signal INN. An output of the primary integrator 151 is changed according to a time constant τ=RC. That is, a negative output of the primary integrator 151 is proportional to a reciprocal of the product of a value of the resistor R1p and a value of the integral capacitor C1p, and a positive output of the primary integrator 151 is proportional to a reciprocal of the product of a value of the resistor R1n and a value of the capacitor C1n.

The secondary integrator 152 includes resistors R2p and R2n, capacitors C2p and C2n, and an operational transconductance amplifier OTA2.

The resistor R2p is connected between a negative output terminal of the primary integrator 151 and a positive input terminal of differential phase input terminals of an OTA 1521. Further, a negative output terminal of differential phase output terminals of the DAC 155 is connected to a positive input terminal of the OTA 1521. The integral capacitor C2p is connected between a positive input terminal of the OTA 1521 and a negative output terminal of the OTA 1521.

The resistor R2n is connected between a positive output terminal of the primary integrator 151 and a negative input terminal of differential phase input terminals of the OTA 1521. Further, a positive output terminal of differential phase output terminals of the DAC 155 is connected to a negative input terminal of the OTA 1521. The integral capacitor C2n is connected between a negative input terminal of the OTA 1521 and a positive output terminal of the OTA 1521.

Operation of such a secondary integrator 152 is the same as that of the primary integrator 151. That is, the secondary integrator 152 inversely integrates and outputs a negative output signal of the primary integrator 151, and inversely integrates and outputs a positive output signal of the primary integrator 151. An output of such a secondary integrator 152 changes according to a time constant τ=RC. That is, a negative output of the secondary integrator 152 is proportional to a reciprocal of the product of a value of the resistor R2p and a value of the capacitor C2p, and a positive output of the secondary integrator 152 is proportional to a reciprocal of the product of a value of the resistor R2n and a value of the capacitor C2n.

The quantizer 153 receives an input of a differential output signal of the secondary integrator 152, quantizes a differential output signal of the secondary integrator 152 to a quantization level according to an operation frequency fs, and outputs the quantization level to the DACs 154 and 155. The quantization level may include 0 and 1, and the number of quantization levels of the quantizer 153 is not limited thereto. When a plurality of quantization levels are used as a quantization level of the quantizer 153, a block such as digital weighted averaging (DWA) may be additionally used.

The DACs 154 and 155 each receive an input of a quantization level with a feedback signal and convert a digital signal to an analog signal. The DAC 154 converts an analog feedback signal to a differential phase signal and outputs the differential phase signal to a differential output terminal of the OTA 1511, and the DAC 155 converts an analog feedback signal to a differential phase signal and outputs the differential phase signal to a differential output terminal of the OTA 1521.

In this way, an output of the LPDSM 15 is determined by an RC time constant of the primary and secondary integrators 151 and 152, and such an RC time constant often changes according to a change of a process, temperature, or time. Therefore, when designing the LPDSM 15, one of items to importantly consider is a process-voltage-temperature (PVT) change.

Figure 3:
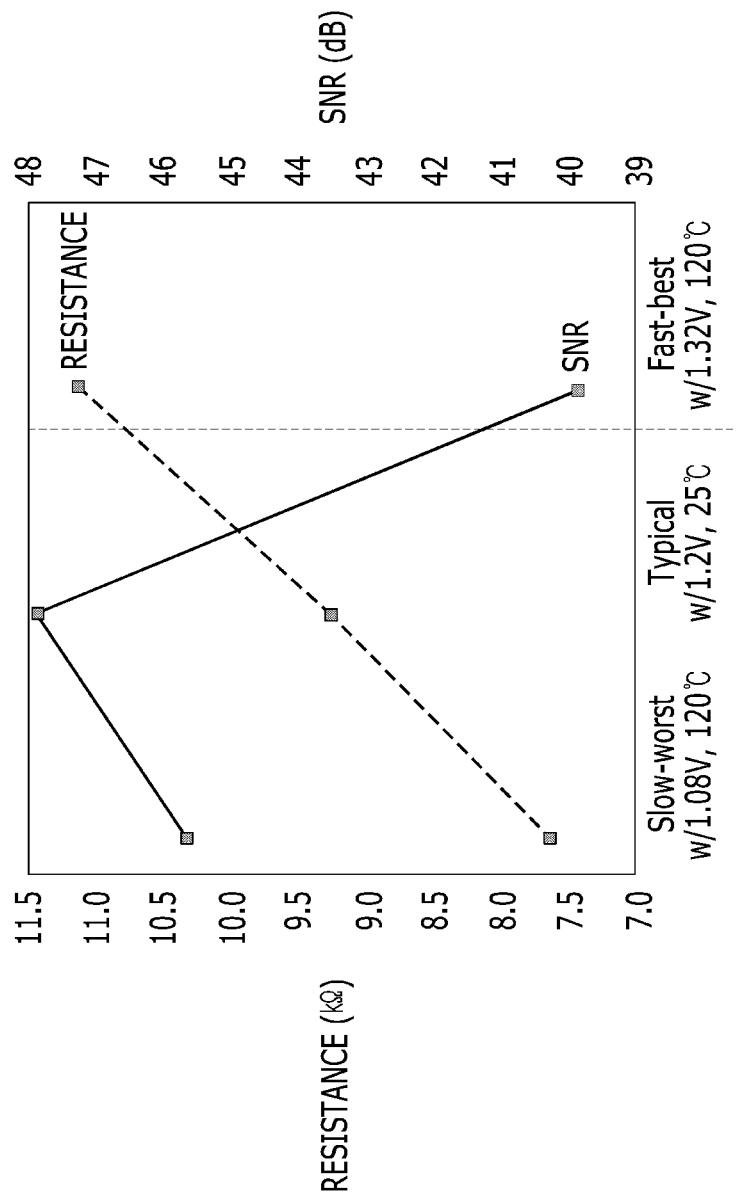
FIG. 3 is a graph illustrating a change of a resistance and a change of an SNR according to a PVT change.

For example, when a simulation is performed using a 130 nm RF process of TSMC company, a result of FIG. 3 is obtained.

FIG. 3 is a diagram illustrating a change of resistance and a change of SNR according to a PVT change, and illustrates a result that is obtained through one resistor (e.g., R1p).

In general, by performing an additional change in a process development kit (PDK) that is provided by a foundry company upon designing, a simulation is performed. That is, a foundry company provides fast-best, typical, and slow-worst conditions to a process development kit (PDK) through basic performance evaluation of elements that are manufactured in a wafer, and such conditions may be determined by a position of the wafer. Such process conditions change one time again according to power supply voltage and temperature characteristics, and when circuit elements are used for an entire system, power supply voltage and temperature characteristics are influenced by a system, and thus when designing the system, a simulation is generally performed by reflecting the power supply voltage and temperature characteristics.

A simulation is performed by combining the above-described conditions in which designers generally perform 3-corner simulation, i.e., performing a simulation with three conditions of a fast-best process condition+110% power supply voltage+low temperature, a typical process condition+ 100% power supply voltage+general temperature, and a slow-worst process condition+90% power supply voltage+ high temperature. Because the three conditions are combinations existing at an edge among all combinations, when the three conditions are generally satisfied, it is regarded that performance levels of other conditions are almost satisfied.

Here, the 110% power supply voltage is a power supply voltage of 1.32 V in a power supply voltage of general 1.2 V, and the 90% power supply voltage is a power supply voltage of 1.08 V in a power supply voltage of general 1.2 V.

As shown in FIG. 3, when a temperature is −40° C. and a voltage is a 110% of the power supply voltage, in a fast-best process condition, a value of a resistor and a value of a capacitor decrease by 20% and 10%, respectively, and when a temperature is 120° C. and a voltage is a 90% of the power supply voltage, in a slow-worst process condition, a value of a resistor and a value of a capacitor increase by 20% and 10%, respectively. Particularly, a value of a resistor has a change of about ±20% relative to a PVT change, whereby it can be determined that signal-to-noise ratio (SNR) characteristics of the LPDSM 15 are degraded by about 3-8 dB.

As shown in FIG. 3, in the LPDSM 15, a time constant calibration apparatus that can prevent performance degradation of the LPDSM 15 by maintaining a designed RC time constant is essentially necessary.

Figure 4:
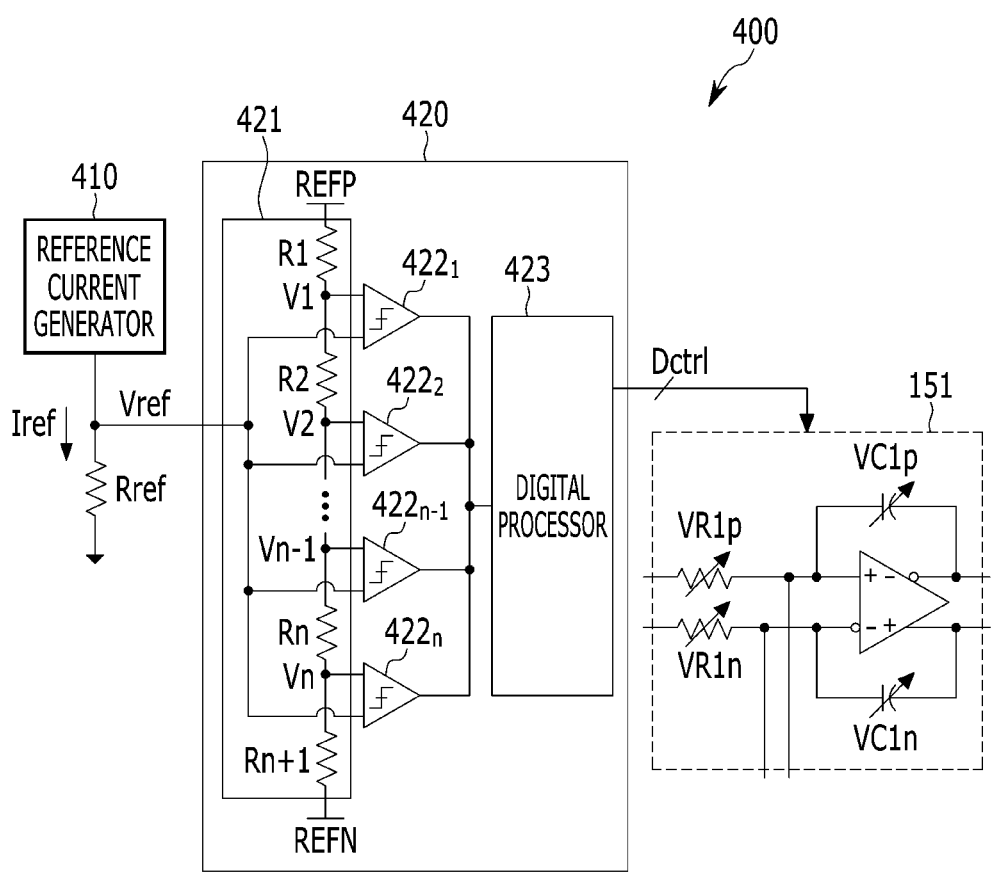
FIG. 4 is a diagram illustrating a time constant calibration apparatus according to an exemplary embodiment of the present invention.

FIG. 4 is a diagram illustrating a time constant calibration apparatus according to an exemplary embodiment of the present invention.

Referring to FIG. 4, the low pass delta sigma modulation apparatus 10 further includes a time constant calibration apparatus 400.

The time constant calibration apparatus 400 includes a reference current generator 410, a reference resistor Rref, and a flash ADC 420.

The time constant calibration apparatus 400 detects a change amount of a resistor according to a PVT change, and varies a value of at least one of a resistor and a capacitor of the primary and secondary integrators 151 and 152 from a digital control signal corresponding to the change amount of the resistor. For this purpose, resistors R1p, R1n, R2p, and R2n of FIG. 2 and integral capacitors C1p, C1n, C2p, and C2n are used as variable resistors and variable capacitors.

That is, as shown in FIG. 4, the primary integrator 151 includes variable resistors VR1p and VR1n and variable capacitors VC1p and VC1n, and the secondary integrator also includes a variable resistor and a variable capacitor. For convenience of description, FIG. 4 illustrates only the primary integrator 151.

Process variation occurs according to a wafer position, and because a size of the LPDSM 15 is not large, in an exemplary embodiment of the present invention, it is basically assumed that change ratios of the reference resistor Rref and the resistors R1p, R1n, R2p, and R2n that are used at the inside of the LPDSM 15 are the same.

As shown in FIG. 3, a change amount of a passive element has a large change of about 20-40%, but a voltage and a current of the reference current generator 410 have characteristics of a constant output within several percent. Therefore, when a reference current Iref flows in a reference resistor Rref that is manufactured through a process, a difference from an actually designed value may be determined. That is, when the reference current Iref flows to the reference resistor Rref, a reference voltage Vref is generated. In this case, because the reference current Iref is not influenced by a process change, the reference voltage Vref is output by a change value of the reference resistor Rref. Therefore, by comparing the reference voltage Vref with reference voltages of the flash ADC 420 through a comparison circuit such as the flash ADC 420, a change amount of a value of the reference resistor Rref may be determined, and by varying at least one of a variable resistor and a variable capacitor of the primary and secondary integrators 151 and 152 through a change amount of a value of the reference resistor Rref, a resistance change may be calibrated according to a process change.

Specifically, the reference current generator 410 generates a reference current Iref. The generated reference current Iref flows to a ground terminal through the reference resistor Rref, and a reference voltage Vref is thus generated. A band-gap reference (BGR) may be used as the reference current generator 410, and may be replaced with a constant current source that is supplied from the outside.

The flash ADC 420 includes a reference voltage generator 421, a plurality of comparators $422_1$-$422_n$, and a digital processor 423. For convenience of description, FIG. 4 illustrates the flash ADC 420 in a single phase input structure, but the flash ADC 420 may be embodied in a differential phase input structure.

The reference voltage generator 421 generates reference voltages V1-Vn to use in the flash ADC 420, and inputs the reference voltages V1-Vn to an inversion input terminal (−) of the comparators $422_1$-$422_n$. The reference voltage generator 421 includes a plurality of resistors R1-R(n+1) that are coupled in series between power sources that supply two voltages Vrefp and Vrefn, respectively. The reference voltages V1-Vn that are input to an inversion input terminal (−) of each of the comparators $422_1$-$422_n$ correspond to voltages that are divided between the two voltages Vrefp and Vrefn using a plurality of resistors R1-R(n+1). In this case, the two voltages Vrefp and Vrefn may be positive voltages, or a voltage Vrefp of the two voltages Vrefp and Vrefn may be a positive voltage and the remaining voltage Vrefn may be a negative voltage. Further, one of the two voltages Vrefp and Vrefn may be a ground voltage.

The comparators $422_1$-$422_n$ have two input terminals (+, −), they compare voltages that are input to the two input terminals (+, −), and they output a pulse signal according to a comparison result.

A reference voltage Vref is input to a non-inversion input terminal (+) of the comparators $422_1$-$422_n$, and reference voltages V1-Vn that are compared with the reference voltage Vref are input to an inversion input terminal (−) of the comparators $422_1$-$422_n$. The comparators $422_1$-$422_n$ each compare the reference voltage Vref and corresponding reference voltages V1-Vn and output a pulse signal according to a comparison result to the digital processor 423, and if the reference voltage Vref is larger than the reference voltages V1-Vn, the comparators $422_1$-$422_n$ output a high level pulse signal, and if the reference voltage Vref is smaller than or equal to the reference voltages V1-Vn, the comparators $422_1$-$422_n$ output a low level pulse signal. Here, a clock is necessary for operation of the comparators $422_1$-$422_n$ that are used for the flash ADC 420, and it may be a clock using in the LPDSM 15 or may be embodied through an external clock by supplying an enable signal.

The digital processor 423 generates a digital control signal Dctrl for varying values of variable resistors and values of variable capacitors of the primary and secondary integrators 151 and 152 from a pulse signal of the comparators $422_1$-$422_n$.

Alternatively, the digital processor 423 may vary only a value of a variable resistor or both a value of a variable resistor and a value of a variable capacitor according to a design specification of the LPDSM 15. For example, an SNR value is included in a design specification of the LPDSM 15, and in an LPDSM 15 having an SNR of less than 50 dB, the digital processor 423 may vary only a variable resistor value without calibration of a variable capacitor, and in an LPDSM 15 having an SNR of 50 dB or more, the digital processor 423 may vary both a value of a variable resistor and a value of a variable capacitor. In general, a change ratio of a resistor is much larger than that of a capacitor. Further, in an LPDSM circuit itself, a parameter change of about 10% may use calibration of only a value of a variable resistor. Particularly, because an SNR of about 40 dB is requested, in a class-S power amplifier, a sufficient effect can be obtained by only calibration of a variable resistor.

Values of a variable resistor and a variable capacitor of the primary and secondary integrators 151 and 152 are varied according to a digital control signal Dctrl.

A resolution of the flash ADC 420 may be determined according to an accurate adjustment level of values of the variable resistor and the variable capacitor of the integrators 151 and 152.

In the flash ADC 420, because a signal that is applied by an input of the flash ADC 420 is a DC signal instead of a sequentially changing signal, dynamic characteristics of the comparators $422_1$-$422_n$ do not have an important influence on the signal and thus the flash ADC 420 may be designed in a very small size.

Figure 5:
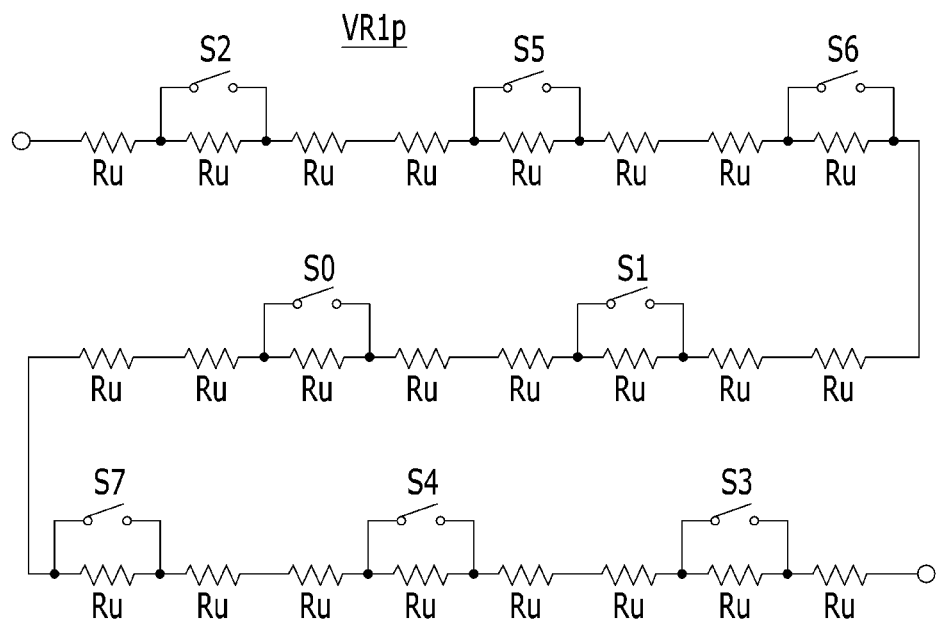
FIG. 5 is a diagram illustrating a variable resistor of an integrator according to an exemplary embodiment of the present invention.

FIG. 5 is a diagram illustrating a variable resistor of an integrator according to an exemplary embodiment of the present invention.

For convenience of description, FIG. 5 illustrates a variable resistor VR1$p$ of the primary integrator 151, and a variable resistor VR1$n$ of the primary integrator 151 or a variable resistor of the secondary integrator 152 may be formed similarly to the variable resistor VR1$p$.

As shown in FIG. 5, the variable resistor VR1$p$ includes a unit resistor column including a plurality of unit resistors Ru that are coupled in series between an input terminal of the LPDSM 15 to which a positive input signal INP is input and a positive input terminal of the OTA 1511 and a plurality of switches, for example, eight switches S1-S8 that are each connected to both ends of some unit resistors Ru of a plurality of unit resistors Ru.

That is, when the digital control signal Dctrl is 7 bits, switches S1-S8 are coupled in parallel to each of both ends of eight unit resistors Ru. Here, the eight unit resistors Ru become redundant resistors. In this case, in order to minimize an influence according to layout of the variable resistor VR1$p$, a unit resistor corresponding to a redundant resistor may be disposed in a symmetrical structure.

The switches S1-S8 each correspond to each bit of the digital control signal Dctrl of each of the switches S1-S8, and are turned on or turned off according to the digital control signal Dctrl.

As the number of turned-on switches S1 increases, a value of the variable resistor VR1$p$ increases.

When switches of the m number are turned on, a total resistance of the variable resistor VR1$p$ is represented by Equation 1.

$$\text{total resistance} = 16 \ast Ru + (8-m) \ast Ru + m \ast Ron\_s \quad \text{[Equation 1]}$$

Here, Ron_s represents an on-resistance of a turned-on switch.

In this way, a value of the variable resistor VR1$p$ is determined by Equation 1, and in order to determine a calibration range of the variable resistor VR1$p$, a value of the unit resistor Ru and on-resistances of switches S1 and S2 are considered. Further, reference voltages V1-Vn of the flash ADC 420 may also be determined to an appropriate value according to a range of the variable resistor VR1$p$.

Figure 6:
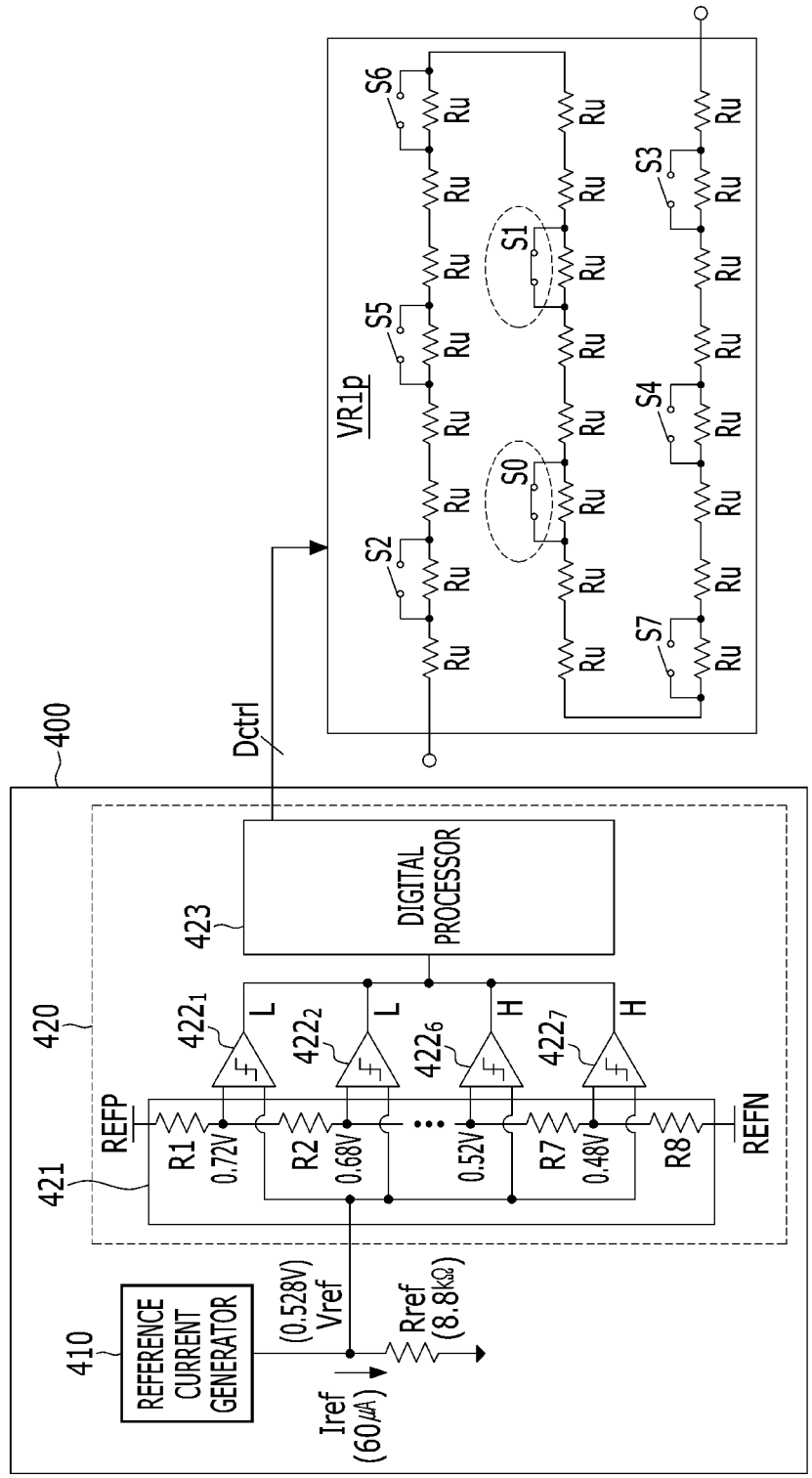
FIG. 6 is a diagram illustrating an example of a time constant calibration apparatus according to an exemplary embodiment of the present invention.

Hereinafter, a method of varying the variable resistor VR1$p$ of the primary integrator 151 through the time constant calibration apparatus 400 that is shown in FIG. 6 will be described.

FIG. 6 is a diagram illustrating an example of a time constant calibration apparatus according to an exemplary embodiment of the present invention.

First, it is assumed that a design resistance of the reference resistor Rref is 10 kΩ and two voltages Vrefp and Vrefn are designed to 0.76 V and 0.44 V, respectively.

As shown in FIG. 6, when a value of the reference resistor Rref is changed to 8.8 kΩ by a PVT change, the reference voltage Vref becomes 0.528 V instead of 0.6 V.

The reference voltage Vref of 0.528 V is input to a non-inversion input terminal (+) of the comparators $422_1$-$422_n$ of the flash ADC 420.

By dividing a voltage difference between two voltages Vrefp and Vrefn to each of eight resistors, reference voltages of 0.72 V, 0.68 V, 0.64 V, 0.60 V, 0.56 V, 0.52 V, and 0.48 V are generated, and 0.72 V, 0.68 V, 0.64 V, 0.60 V, 0.56 V, 0.52 V, and 0.48 V are each input to an inversion input terminal of the comparators $422_1$-$422_n$ of the flash ADC 420.

The comparators $422_1$-$422_n$ of the flash ADC 420 each compare a reference voltage Vref of 0.528 V that is input to a non-inversion input terminal (+) and a reference voltage of 0.72 V, 0.68 V, 0.64 V, 0.60 V, 0.56 V, 0.52 V, and 0.48 V that are input to an inversion input terminal (−) and output a pulse signal according to a comparison result. As a comparison result, the comparators $422_1$-$422_n$ output a low level L, a low level L, a low level L, a low level L, a low level L, a high level H, and a high level H, respectively.

By combining output levels of pulse signals of the comparators $422_1$-$422_n$, the digital processor 423 generates a digital control signal Dctrl for varying the variable resistor VR1p. For example, the digital processor 423 may generate a digital control signal Dctrl of "0000011" from pulse signals of a low level L, a low level L, a low level L, a low level L, a low level L, a high level H, and a high level H.

By the digital control signal Dctrl of "0000011", two switches are turned on and the remaining switches are turned off, and switches S1 and S2 corresponding to lowest-level two bits of "0000011" are turned on and the remaining switches S3-S8 are turned off. Accordingly, a value of the variable resistor VR1p is calibrated.

Figure 7:
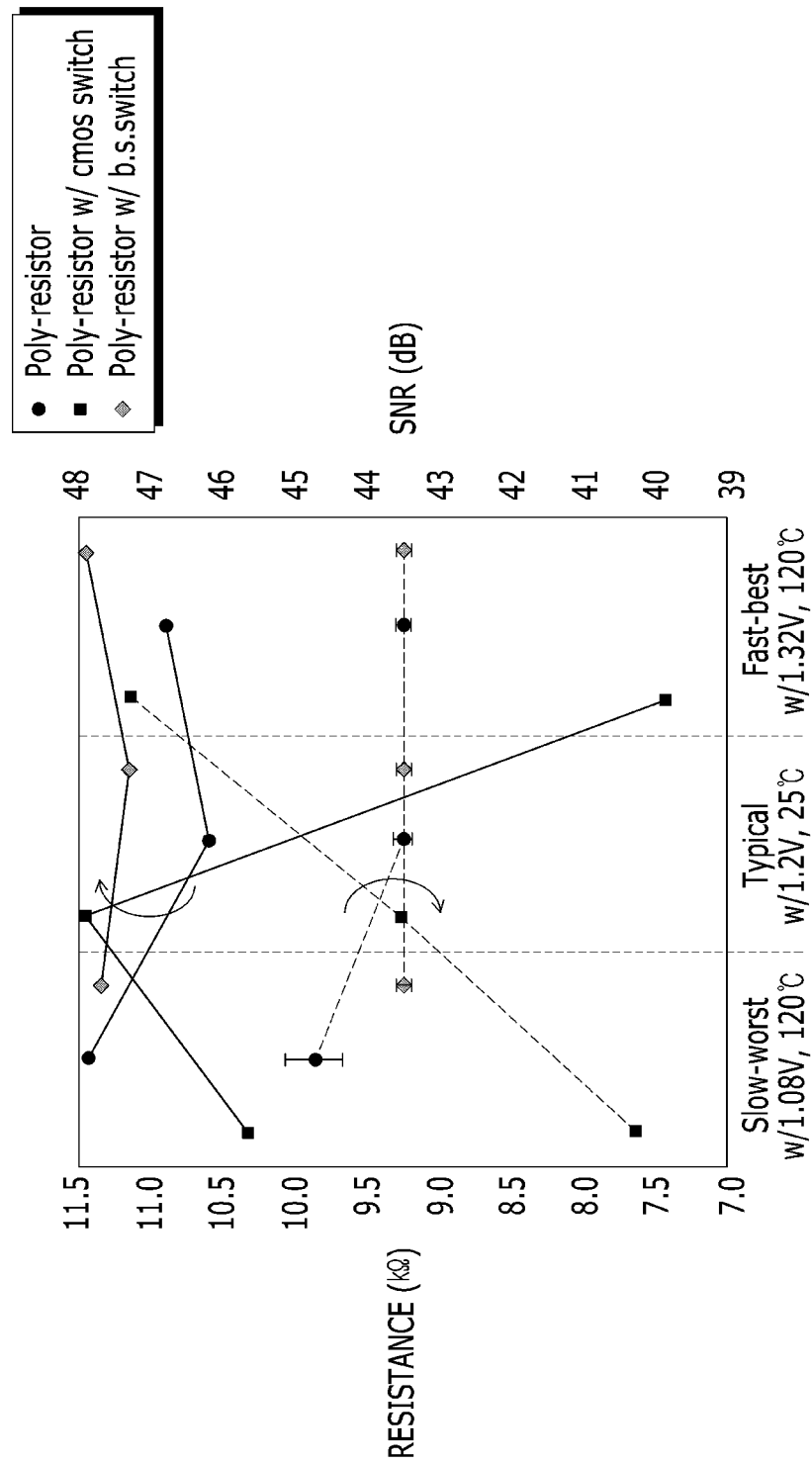
FIG. 7 is a graph illustrating a change of a resistance and a change of an SNR according to a type of a switch that is used for a time constant calibration apparatus according to an exemplary embodiment of the present invention.

FIG. 7 is a graph illustrating a change of a resistance and a change of an SNR according to a type of a switch that is used for a time constant calibration apparatus according to an exemplary embodiment of the present invention.

First, in the above-described variable resistor VR1p, one item should be additionally considered. A signal that is input to the variable resistor VR1p that is positioned at an input terminal of the LPDSM 15 is a sequentially changing signal. Therefore, when a complementary metal-oxide-semiconductor (CMOS) switch is used as switches S1-S8, a resistance value thereof is changed according to the magnitude of an input signal and thus the entire resistance changes according to the signal magnitude.

As shown in FIG. 7, in a resistance using a CMOS switch as switches S1-S8 through an error bar, particularly in a slow-worst condition, a change of the resistance becomes 500 Ω or more.

Further, because SNR characteristics when using a CMOS switch are changed by about 2 dB, in the LPDSM 15 of a low resolution, it is not a large problem to use such a CMOS switch, but in the LPDSM 15 of a somewhat high resolution, it is necessary to constantly maintain a change of a resistance through a bootstrapped (b.s.) switch.

As shown in FIG. 7, when the b.s. switch is used for switches S1-S8, in all conditions, a change of a resistance is almost constant, and SNR characteristics are also almost constant.

Therefore, according to an exemplary embodiment of the present invention, a bootstrap switch may be used for the switches S1-S8.

In this way, after a value of the variable resistor VR1p is calibrated, the time constant calibration apparatus 400 calibrates values of variable capacitors of the primary and secondary integrators 151 and 152.

Figure 8:
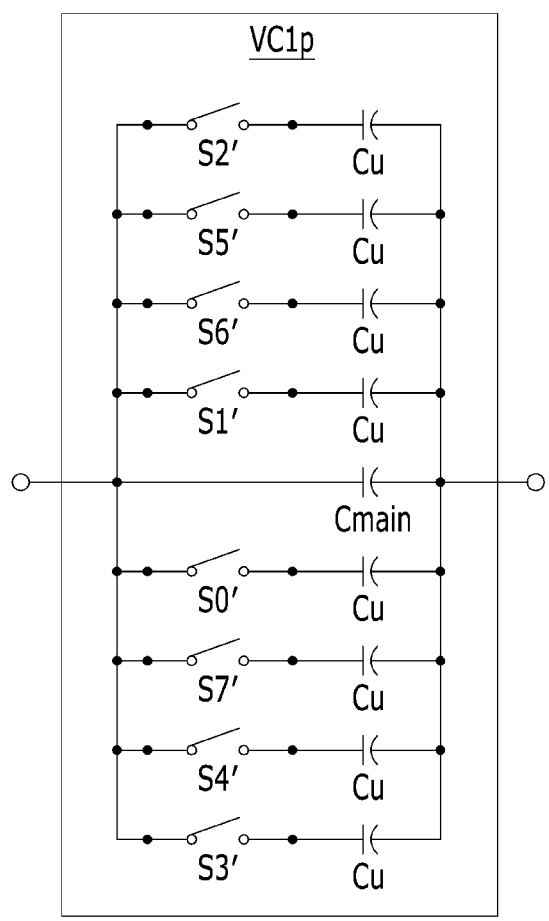
FIG. 8 is a diagram illustrating a capacitor of an integrator according to an exemplary embodiment of the present invention.

FIG. 8 is a diagram illustrating a capacitor of an integrator according to an exemplary embodiment of the present invention.

For convenience of description, FIG. 8 illustrates a variable capacitor VC1p of the primary integrator 151, and the variable capacitor VC1n of the primary integrator 151 or the variable capacitor of the secondary integrator 152 may also be formed similarly to the variable capacitor VC1p.

Referring to FIG. 8, the variable capacitor C1p includes a unit capacitor column including a capacitor Cmain that is connected between a positive input terminal and a negative output terminal of the OTA 1511, and a plurality of unit capacitors Cu that are each coupled in parallel between the positive input terminal and the negative output terminal of the OTA 1511 and a plurality of switches, for example, eight switches S0'-S7' that are connected between each unit capacitor Cu and the positive input terminal of the OTA 1511. In this case, the switches S0'-S7' may be connected between each unit capacitor Cu and the negative output terminal of the OTA 1511.

The eight switches S0'-S7' are turned on or turned off by a digital control signal Dctrl, and operate in a method opposite to that of the variable resistor VR1p. For example, by a digital control signal Dctrl of "0000011", in the variable resistor VR1p, two switches S0 and S1 are turned on and the remaining switches S2-S7 are turned off, but in the variable capacitor VC1p, two switches are turned off and the remaining switches are turned on.

That is, in the flash ADC 420, when a digital control signal Dctrl is generated according to a change of a reference resistor Rref, values of variable resistors and variable capacitors of the primary and secondary integrators 151 and 152 are determined by the digital control signal Dctrl.

In this case, a compensation range of the variable capacitor VC1p is determined according to a process, and in a 130 nm process of TSMC Company, a compensation range of the variable capacitor VC1p may be set to half of a compensation range of the variable resistor VR1p. In other words, when a compensation range of the variable resistor VR1p of 10 kΩ is ±20%, a compensation range of the variable capacitor VC1p becomes ±10%. That is, by setting "compensation range of the variable resistor VR1p"=k* compensation range of the variable capacitor VC1p, a value of the variable capacitor VR1p may be determined.

Figure 9:
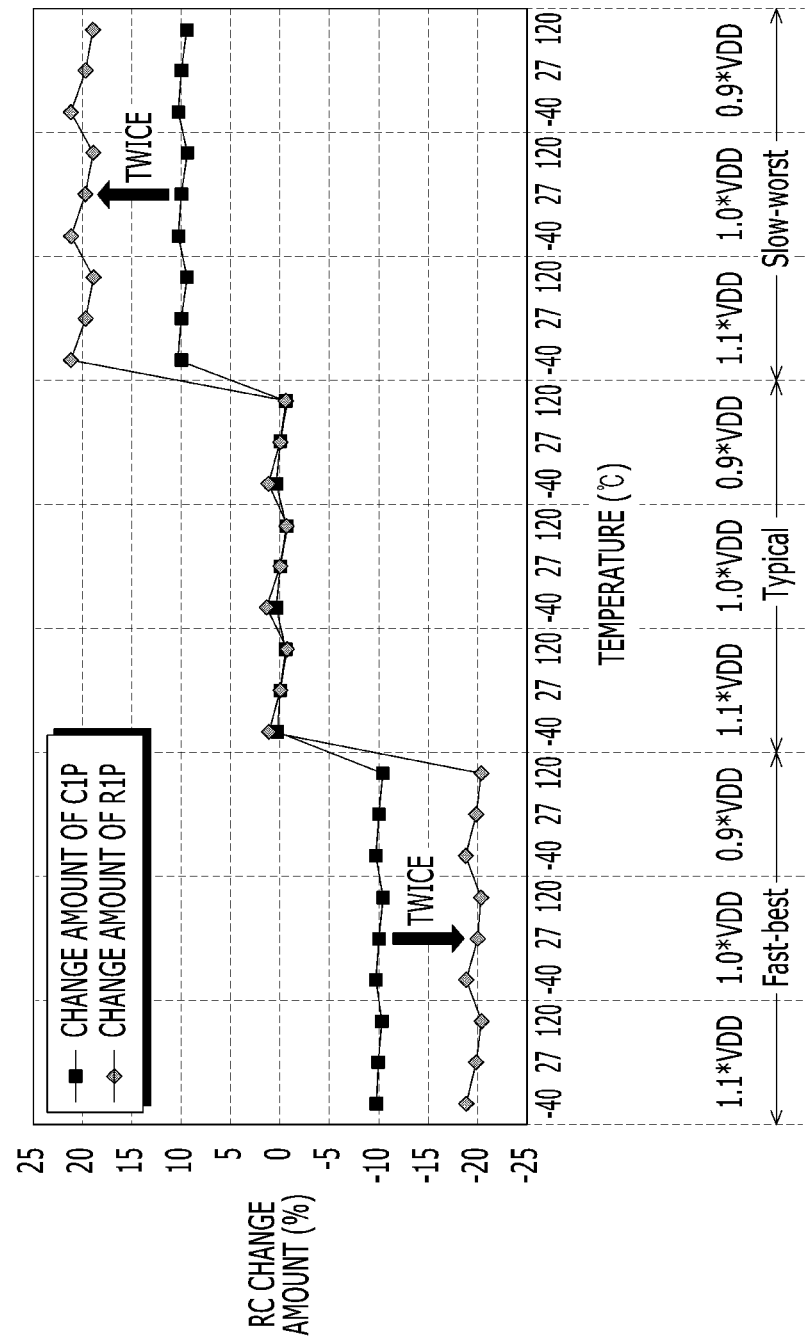
FIG. 9 is a graph illustrating a change ratio of a resistor and a capacitor according to a PVT change in a TSMC 130 nm process.

FIG. 9 is a graph illustrating a change ratio of a resistor and a capacitor according to a PVT change in a TSMC 130 nm process.

As shown in FIG. 9, in a corner condition, a change ratio of a value of a variable resistor (R1p of FIG. 2) is double that of a value of a variable capacitor (C1p of FIG. 2) and is almost constant.

Further, in a fast-best condition, because both a value of the resistor R1p and a value of the integral capacitor C1p decrease, the digital processor 423 of the time constant calibration apparatus 400 compensates in a direction that increases both a value of the variable resistor VR1p and a value of the variable capacitor VC1p, and in a slow-worst condition, because both a value of the resistor R1p and a value of the integral capacitor C1p increase to larger than designed values, the digital processor 423 of the time constant calibration apparatus 400 compensates in a direction that decreases both a value of the variable resistor VR1p and a value of the variable capacitor VC1p.

That is, the time constant calibration apparatus 400 detects a change of a reference resistor Rref according to a corner condition and controls a value of the variable resistor VR1$p$ and a value of the variable capacitor VC1$p$ through a digital value that is obtained by processing the change with the flash ADC 420, thereby compensating a time constant. Some difference may exist in a k value according to each foundary company and a technology node of a process, but the time constant calibration apparatus 400 may simultaneously set a value of the variable resistor VR1$p$ and a value of the variable capacitor VC1$p$ according to the k value.

According to an exemplary embodiment of the present invention, a PVT change amount can be easily compensated through a simple analog block without assistance of a complicated algorithm and a digital block.

Further, by compensating a value of a passive element such as a resistor and a capacitor, it is unnecessary to compensate a block that performs an important function when operating an entire circuit, and thus a circuit can stably operate.

In general, a change of a resistor and a capacitor are measured and compensated, but according to an exemplary embodiment of the present invention, by grasping and compensating a change ratio of a resistance, a compensation value of a capacitor can be automatically determined.

Because a flash analog-to-digital converter (ADC) that is used for measuring a change of a resistance receives a DC input, a design of the flash ADC is hardly restricted, and the flash ADC can easily be embodied without using an additional clock or unintelligible circuit technique.

Further, by using a bootstrapped switch for adjusting a value of a variable resistor, reliability of an LPDSM can be further improved.

An exemplary embodiment of the present invention may not only be embodied through the above-described apparatus and/or method, but may also be embodied through a program that executes a function corresponding to a configuration of the exemplary embodiment of the present invention or through a recording medium on which the program is recorded, and can be easily embodied by a person of ordinary skill in the art from a description of the foregoing exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An apparatus that calibrates a time constant of an integrator using a resistor and a capacitor in a low pass delta sigma modulation apparatus, the apparatus comprising:
   a reference current generator that generates a reference current;
   a reference resistor that is connected between the reference current generator and a ground terminal;
   a comparison circuit that compares a first reference voltage that is generated by the reference resistor and the reference current and a plurality of second reference voltages, and that converts the first reference voltage to a digital signal; and
   a digital processor that generates a digital control signal that varies a value of at least one of the resistor and the capacitor from the digital signal and that outputs the digital control signal to the integrator,
   wherein the resistor includes:
      a plurality of unit resistors that are coupled in series between an input terminal of the low pass delta sigma modulation apparatus and an operational transconductance amplifier of the integrator, and
      a plurality of first switches that are each connected to both ends of some unit resistors of the plurality of unit resistors,
   wherein on/off of the plurality of first switches is determined according to the digital control signal.

2. The apparatus of claim 1, wherein the capacitor comprises:
   a plurality of unit capacitors that are each coupled in parallel between an input terminal and an output terminal of the operational transconductance amplifier; and
   a plurality of second switches that are connected between each unit capacitor and an input terminal of the operational transconductance amplifier or that are connected between each unit capacitor and the output terminal of the operational transconductance amplifier,
   wherein on/off of the plurality of second switches is determined according to the digital control signal.

3. The apparatus of claim 2, wherein a variable range of the capacitor according to the digital control signal is set to half of a variable range of the resistor according to the digital control signal.

4. The apparatus of claim 2, wherein the number of the first switches that are turned on and the number of the second switches that are turned off according to the digital control signal are the same.

5. The apparatus of claim 1, wherein the comparison circuit comprises a flash analog-to-digital converter.

6. The apparatus of claim 1, wherein the reference current generator comprises a constant current source.

7. An apparatus that calibrates a time constant of an integrator using a resistor and a capacitor in a low pass delta sigma modulation apparatus, the apparatus comprising:
   a reference current generator that generates a reference current;
   a reference resistor that is connected between the reference current generator and a ground terminal;
   a comparison circuit that compares a first reference voltage that is generated by the reference resistor and the reference current and a plurality of second reference voltages, and that converts the first reference voltage to a digital signal; and
   a digital processor that generates a digital control signal that varies a value of at least one of the resistor and the capacitor from the digital signal and that outputs the digital control signal to the integrator,
   wherein the digital processor varies only a value of the resistor or both values of the resistor and the capacitor according to an SNR, which is a design specification of the low pass delta sigma modulation apparatus.

8. A method of calibrating a time constant of an integrator using a resistor and a capacitor in a time constant calibration apparatus of a low pass delta sigma modulation apparatus, the method comprising:
   generating a reference current;
   detecting a change amount of a reference resistor by flowing the reference current to the reference resistor;
   generating a digital control signal to correspond to the change amount of the reference resistor; and
   varying a value of at least one of the resistor and the capacitor according to the digital control signal,
   wherein the resistor comprises:
      a plurality of unit resistors that are coupled in series between an input terminal of the low pass delta sigma modulation apparatus and an operational transconductance amplifier of the integrator, and a plurality of first switches that are each connected to both ends of some unit resistors of the plurality of unit resistors, wherein the varying of a value comprises turning on at least one of the plurality of first switches according to the digital control signal.

9. The method of claim 8, wherein the capacitor comprises:

a plurality of unit capacitors that are each coupled in parallel between an input terminal and an output terminal of the operational transconductance amplifier; and a plurality of second switches that are connected between each unit capacitor and the input terminal of the operational transconductance amplifier or that are connected between each unit capacitor and the output terminal of the operational transconductance amplifier, wherein the varying of a value comprises turning on at least one of the plurality of second switches according to the digital control signal.

10. The method of claim 9, wherein the number of the first switches that are turned on and the number of the second switches that are turned off according to the digital control signal are the same.

11. The method of claim 8, wherein the detecting of a change amount comprises:

generating a first reference voltage by flowing the reference current to the reference resistor; and converting the first reference voltage to a digital signal.

12. The method of claim 8, further comprising outputting the digital control signal to only the resistor or to the resistor and the capacitor according to a design specification of the low pass delta sigma modulation apparatus.

* * * * *